(12) United States Patent
Su et al.

(10) Patent No.: US 6,456,736 B1
(45) Date of Patent: Sep. 24, 2002

(54) AUTOMATIC FIELD SAMPLING FOR CD MEASUREMENT

(75) Inventors: Bo Su, San Jose; Zoe Osborne, Palo Alto, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,092

(22) Filed: Feb. 16, 1999

(51) Int. Cl.[7] .......................... G06K 9/00; G06K 9/62; G01B 5/16; H04N 7/18; G01R 31/26

(52) U.S. Cl. .................. 382/147; 382/228; 73/156; 348/126; 438/16

(58) Field of Search ................................. 382/141, 144, 382/145, 146, 147, 148, 149, 150, 160, 228, 286; 430/5, 22, 304; 73/156; 348/125, 126; 438/16, 717; 356/401; 716/21

(56) References Cited

U.S. PATENT DOCUMENTS

| | | | |
|---|---|---|---|
| 4,890,239 A | * 12/1989 | Ausschnitt et al. | 716/21 |
| 5,757,507 A | * 5/1998 | Ausschnitt et al. | 356/401 |
| 6,012,058 A | * 1/2000 | Fayyad et al. | 707/6 |
| 6,159,662 A | * 12/2000 | Chen et al. | 430/313 |
| 6,208,747 B1 | * 3/2001 | Nguyen et al. | 382/100 |
| 6,215,896 B1 | * 4/2001 | Grieg et al. | 382/149 |
| 6,246,787 B1 | * 6/2001 | Hennessey et al. | 382/141 |

OTHER PUBLICATIONS

Elizabeth E. Chain, "Automated Metrology Qualification Strategy", 1996, pp. 337–342.*

* cited by examiner

Primary Examiner—Amelia M. Au
Assistant Examiner—Mehrdad Dastouri
(74) Attorney, Agent, or Firm—McDermott, Will & Emery

(57) ABSTRACT

A method and apparatus is provided for inspecting a semiconductor wafer for field-to-field critical dimension (CD) variations using statistical techniques, such that an optimal number of fields on the wafer under inspection are measured, thereby increasing the accuracy of the results of the inspection procedure and avoiding unnecessary sampling. Embodiments include randomly selecting a predetermined number of fields on a semiconductor wafer to be inspected, and measuring the CD of a comparable feature in each of the sample fields, as by a critical dimension scanning electron microscope (CD-SEM). A statistical function, such as an average or standard deviation, of the measured CDs is calculated. Further fields are the randomly selected, CDs measured, and the running average or standard deviation calculated after each CD is measured. If the last acquired CD does not change the average or standard deviation by a predetermined amount, the inspection procedure for the wafer under inspection is terminated. Otherwise, the random field sampling, CD measurement and running average or standard deviation calculation continues. Because the number of fields to be sampled is not fixed, sampling continues as necessary without oversampling or undersampling, thereby obtaining statistically accurate results and increasing production throughput.

24 Claims, 6 Drawing Sheets

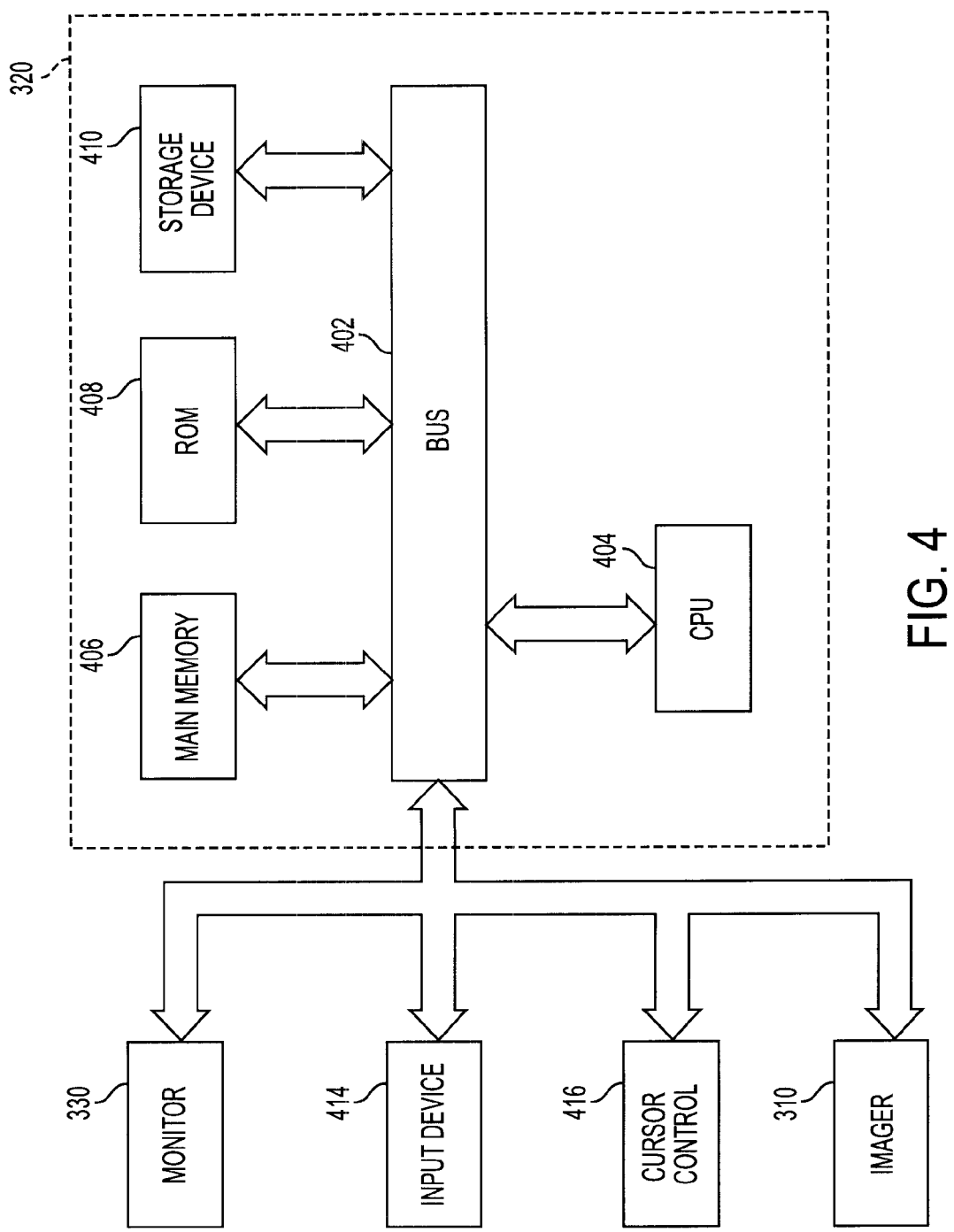

AUTOMATIC FIELD SAMPLING FOR CD MEASUREMENT

FIELD OF THE INVENTION

The present invention relates to a method for monitoring processing carried out on a semiconductor substrate, and more particularly for inspecting the critical dimensions of features formed on the semiconductor substrate using statistical sampling. The invention has particular applicability for in-line inspection of semiconductor wafers during manufacture of high-density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional in-process monitoring typically includes statistical process control techniques, wherein critical dimensions (CDs) of selected devices or "fields" on wafers are measured, as by a critical dimension scanning electron microscope (CD-SEM), to identify lot-to-lot variations, wafer-to-wafer variations within a lot, and field-to-field variations between devices on a single wafer. This information is thereafter used in diagnosing processing problems. The measurement of field-to-field CD variation has been found to be one of the most meaningful indicators of process control effectiveness; i.e., a large variation in CDs of comparable features of different fields on a single wafer indicates process control problems. Therefore, statistical measurement of field-to-field CD variation is typically performed as a standard inspection procedure at an automated inspection tool, such as the 7830SI or VeraSEM, available from Applied Materials of Santa Clara, Calif.

In one type of automated inspection procedure, wherein CDs of comparable features in several sample fields on a wafer are measured, sampling is dictated by a "recipe" such that the same points are sampled on every wafer under inspection. However, such fixed-field sampling leads to statistical errors, as when repeated appearances of a high systematic error data point amplifies the total error, thus inaccurately representing the errors present in the whole population. For example, due to the round shape of the wafers and the limitations of the photoresist application process steps such as coating and baking, a center-to-edge CD variation typically (i.e., systematically) exists. Thus, if one of the fixed sample fields is in an area of the wafer adversely affected by such a systematic CD variation, the error always present in that point will cause the total measured error in the wafer to increase. Furthermore, the fixed-field sampling technique requires a relatively large number of points be measured on each wafer under inspection; e.g., up to about 17 points. Such measuring requires a significant amount of time and thereby reduces production throughput.

To reduce inspection time and to avoid the inherent statistical errors of fixed-field sampling, some automatic inspection schemes employ random field sampling, wherein a predetermined number of fields (specified by the user) on each wafer under inspection are randomly selected for CD measurement. The random field selection technique yields more accurate results from fewer fields vis-a-vis fixed-field methodology.

However, because the number of randomly selected fields is a constant predetermined number, undersampling or oversampling may occur using this technique, depending on the selection of the predetermined number of fields. For example, oversampling may occur, thereby unnecessarily prolonging the inspection and reducing production throughput, when the CD variation from field to field is extremely small or nonexistent, because a lesser number of samples than the predetermined number are needed to obtain a statistically accurate result in this situation. On the other hand, undersampling may occur, leading to inaccurate statistical results, when the field-to-field CD variation is relatively large, because a greater number of samples than the predetermined number may be needed in this situation.

There exists a need for a more accurate and cost-effective methodology for in-process inspection of semiconductor wafers to provide information relating to feature CDs for statistical process control, in order to identify processes causing defects, thereby enabling early corrective action to be taken. This need is becoming more critical as the density of surface features, die sizes, and number of layers in devices increase, requiring the number of defects to be drastically reduced to attain an acceptable manufacturing yield.

SUMMARY OF THE INVENTION

At advantage of the present invention is the ability to perform inspection of features on randomly selected fields of a semiconductor wafer for statistical process control without oversampling or undersampling, thereby obtaining statistically accurate results and increasing production throughput According to the present invention, the foregoing and other advantages are achieved in part by a method of inspecting the surface of an article having a plurality of comparable pattern units, each pattern unit having a feature, which method comprises randomly selecting a predetermined number (i.e., one or more) of the plurality of pattern units for measurement, measuring a critical dimension (CD) of the feature in each of the randomly selected pattern units to produce a first plurality of CDs, then calculating a statistical function (e.g., an average or standard deviation) using the fast plurality of CDs to produce a first statistical function value. An additional pattern unit of the plurality of pattern units is then randomly selected, the CD of the feature is measured, and the statistical function is calculated using the first plurality of CDs and the CD of the feature in the additional pattern unit to produce a current statistical function value. The inspection of the surface of the article is then terminated if the difference between the current statistical function value and the first statistical function value is less than a predetermined amount. If the current statistical function value changes the statistical function value more than the predetermined amount, the inspection continues with further random selection of additional pattern units.

Another aspect of the present invention is an apparatus for carrying out the above method.

A further aspect of the present invention is a computer-readable medium bearing instructions for inspecting the surface of an article having a plurality of comparable pattern units, each pattern unit having a feature, said instructions, when executed, being arranged to cause one or more processors to perform the steps of randomly selecting a predetermined number of the plurality of pattern units for measurement, controlling an inspection tool to measure a critical dimension (CD) of the feature in each of the randomly selected pattern units to produce a first plurality of CDs, calculating a statistical function using the first plurality of CDs to produce a first statistical function value, randomly selecting an additional pattern unit of the plurality of pattern units for measurement, controlling the inspection tool to measure the CD of the feature in the additional pattern unit, calculating the statistical function using the first plurality of CDs and the CD of the feature in the additional pattern unit to produce a current statistical function value, and terminating the inspection of the surface of the article based on the first and current statistical function values.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 4 is a block diagram that illustrates an embodiment of the invention.

DESCRIPTION OF THE INVENTION

Conventional methodologies for performing statistical in-process inspection for field-to-field variations of CDs of features formed on the surface of a semiconductor wafer typically yield inaccurate statistical results, unnecessarily prolong the inspection procedure, or both, thereby reducing production throughput and hindering the diagnosis of processing problems. The present invention addresses and solves these problems by ensuring that an optimal number of fields on the wafer under inspection are measured, thereby increasing the accuracy of the statistical results of the inspection procedure and avoiding unnecessary sampling.

According to the methodology of the present invention, a predetermined number of fields on a semiconductor wafer to be inspected are randomly selected; e.g., three fields, and a CD of a comparable feature in each of the sample fields are measured, as by a CD-SEM. A statistical function, such as an average or standard deviation, of the measured CDs is calculated after CDs from the predetermined number of fields are acquired; e.g., after the third CD is acquired. Further fields are then randomly selected, CDs measured, and the running average or standard deviation calculated. If the last acquired CD; e.g., the fourth CD, does not change the average or standard deviation by a differential amount previously selected by the user, the inspection procedure for the wafer under inspection is terminated. If the last acquired CD changes the average or standard deviation by at least the previously selected differential amount, the random field sampling continues. Thus, the number of fields to be sampled is not fixed, as in prior art techniques. Rather, sampling continues as necessary based on the user-selected amount of change for the statistical function (i.e., the differential amount) without oversampling or undersampling, thereby obtaining statistically accurate results and increasing production throughput.

Figure 1:
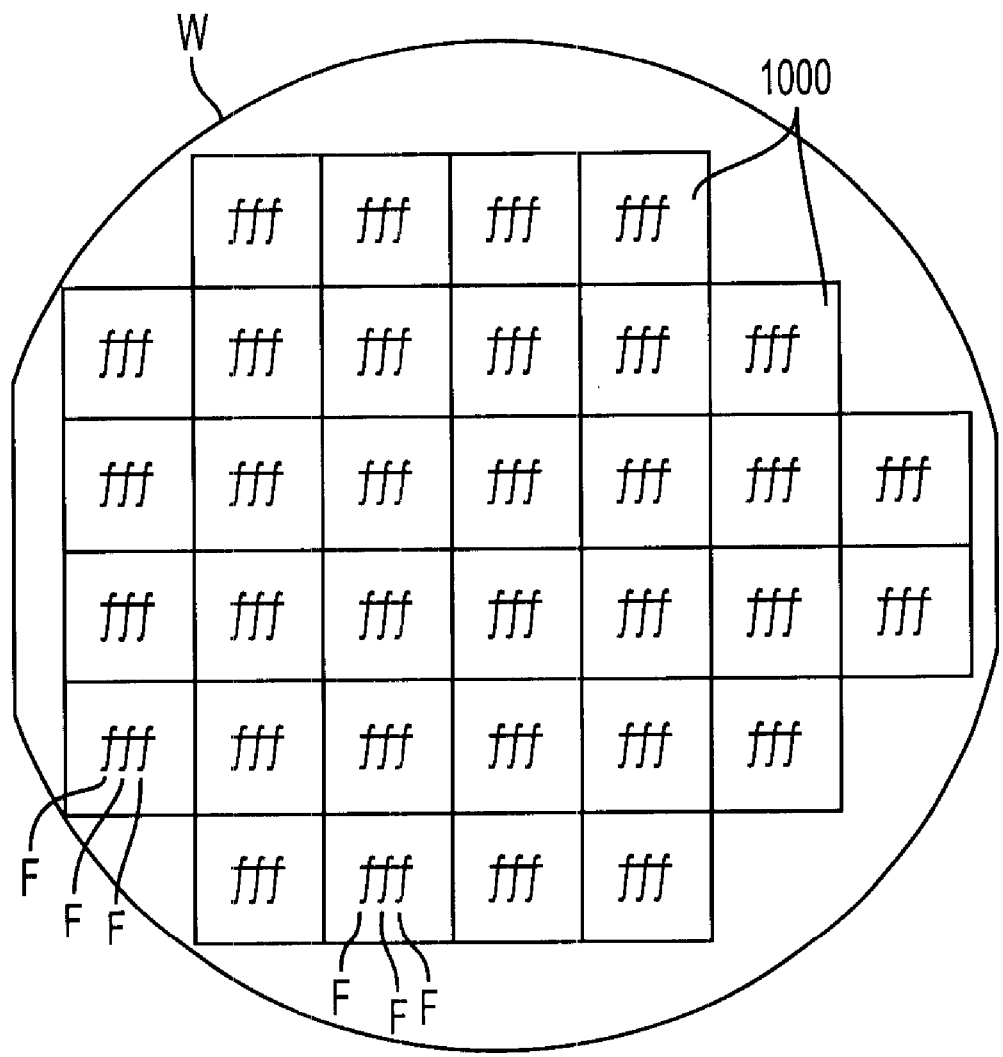
FIG. 1 illustrates a semiconductor wafer to be inspected using the present intention.
Figure 2A:
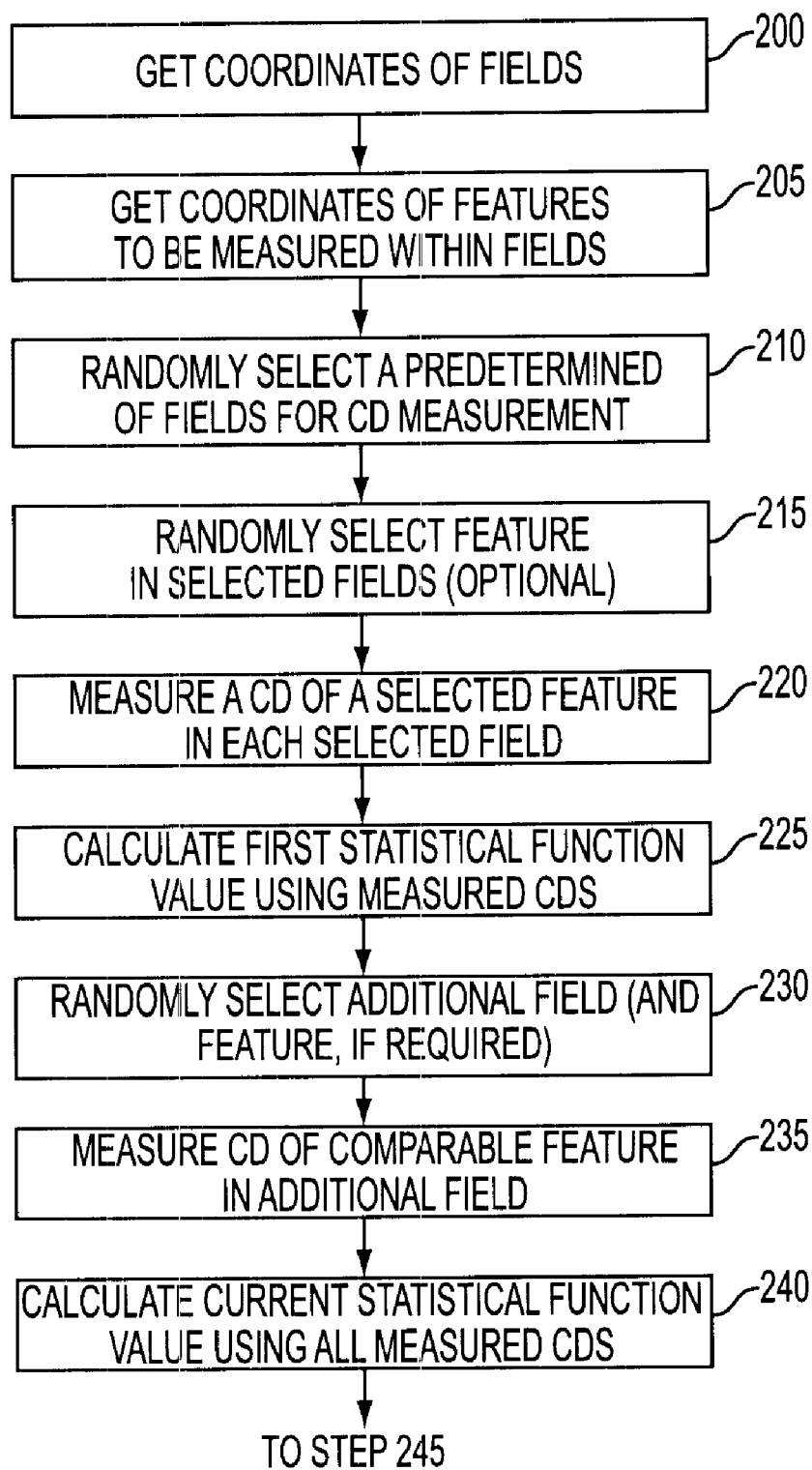
FIGS. 2A–2C are flow charts illustrating sequential steps in a method according to an embodiment of the present invention.
Figure 2B:
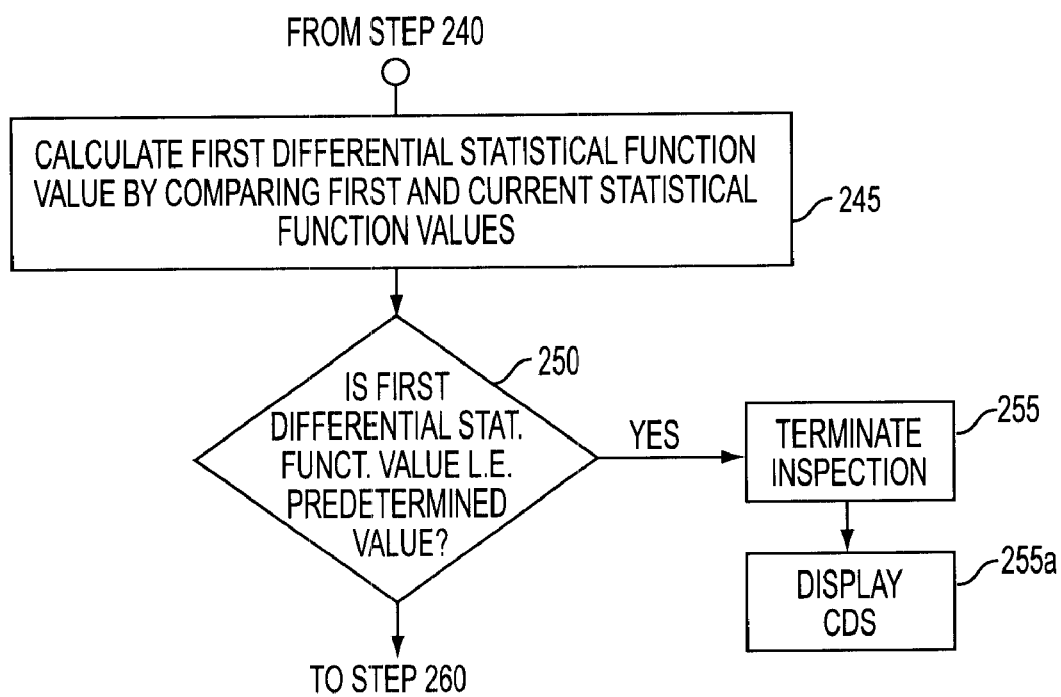
Figure 2C:
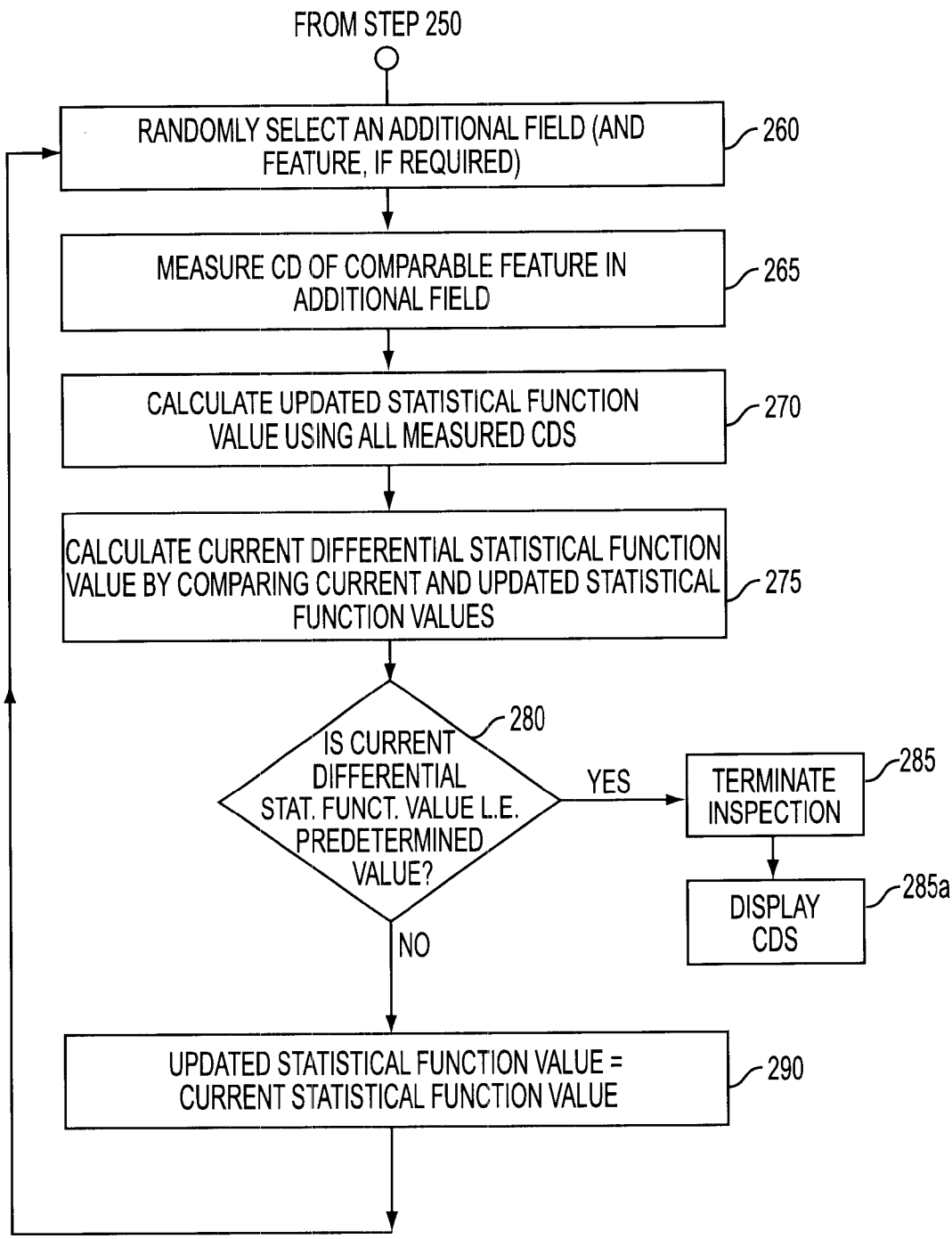
Figure 3:
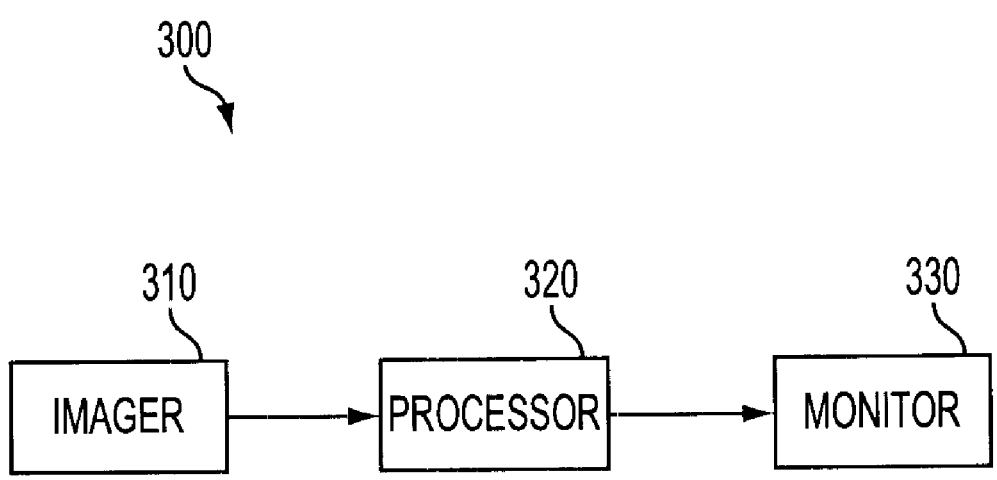
FIG. 3 schematically illustrates an apparatus used to implement the present invention.

An embodiment of the present invention is illustrated in FIGS. 1–4. As shown in FIG. 1, a semiconductor wafer W to be inspected is processed (prior to inspection) to have a plurality of patterned integrated circuit dies or "fields" 1000, each field 1000 having a comparable feature F formed on the surface of wafer W. Feature F can be, for example, a metal interconnection line, a trench, a via, a conductive gate, etc. Furthermore, feature F can appear more than once in each field 1000; for example, if fields 1000 are memory chips, feature F can appear in each memory cell in each field 1000. The present invention is implemented at an inspection tool 300, as shown in FIG. 3, comprising an imager 310 for measuring a CD of feature F, such as a CD-SEM, a defect review SEM, or an optical inspection tool. An atomic force microscope (AFM) which uses the interaction of a microscopic probe with the surface of a sample to measure characteristics of the sample at localized points, can also be employed for CD measurement. Inspection tool 300 further comprises a processor 320, which preferably performs the analysis disclosed herein electronically, and a monitor 330 for displaying results of the analyses of processor 320.

Referring now to FIGS. 2A, 2B, 2C and 3, wafer W is brought to inspection tool 300, and processor 320 is provided with the coordinates (i.e., the location on wafer W) of fields 1000 and features F in the population to be sampled for CD measurement (see steps 200 and 205). The coordinates can be stored in and/or obtained from a computer software-implemented database system known as a manufacturing execution system (MES), or can be stored locally at inspection tool 300. Next, processor 300 randomly selects for CD measurement, at step 210, a predetermined number of fields 1000 for CD measurement. The predetermined number of fields can be one field or a plurality of fields, as selected by the user of the invention based on the users experience with the process performed on wafer W prior to inspection. For example, if wafer W has been subject to a "mature" process immediately before inspection; i.e., an established process from which the user is currently getting good results, the user may specify a low predetermined number, since the user experts to experience a small CD variation. On the other hand, if the process is currently problematic and the user expects a large CD variation, the user may wish to increase the predetermined number to increase the sample size.

Imager 310 images each of the selected fields 1000 to measure a CD of feature F located on each selected field 1000 (see step 220). Note that if a plurality of features F in each field 1000 are included in the population, processor 320 first randomly selects, at step 215, which feature F in each of the predetermined number of fields 1000 is to be measured. Next, at step 225, processor 320 calculates a statistical function using the measured CDs, such as a well-known statistical function such as an average, standard deviation, t-test, etc., to produce a "first statistical function value". At step 230, processor 320 randomly selects an additional field 1000 for CD measurement (and randomly selects one feature F an the selected field, if such a selection is required), and at step 235 imager 310 measures the CD of feature F on additional field 1000. Processor 320 then calculates the statistical function using all the measured CDs (see step 240) to produce a "current statistical function value".

At step 245 (see FIG. 2B), processor 320 calculates a "first differential statistical function value" by comparing the current statistical function value and the first statistical function value. Processor 320 then compares the first differential statistical function value to a predetermined difference value set by a user of inspection tool 300 (see step 250). If the first differential statistical function value is less than or equal to the predetermined difference value, indicating that the last acquired CD did not change the statistical function, processor 320 terminates the inspection procedure at step 255 and displays the measured CDs at step 255a.

On the other hand, if the first differential statistical function value is greater than the predetermined difference value, processor 320 randomly selects a further additional field 1000 (and randomly selects a feature F on selected field 1000, if required) at step 260 (see FIG. 2C), imager 310 measures the CD of feature F on this additional field 1000 (see step 265), and processor 320 calculates the statistical function using all the measured CDs (see step 270) to produce an "updated statistical function value".

At step 275, processor 320 calculates a "current differential statistical function value" by comparing the updated statistical function value from step 270 and the current statistical function value from step 240, and then compares the current differential statistical function value to the predetermined difference value (see step 280). If the current differential statistical function value is less than or equal to the predetermined difference value, indicating that the last acquired CD did not change the statistical function, processor 320 terminates the inspection procedure at step 285 and displays the measured CDs at step 285a. If the current differential statistical function value is greater than the predetermined difference value, processor 320 repeats steps 260–280 using the updated statistical function value of step 275 as the current statistical function value in step 275 (see step 290). The inspection procedure continues until a differential statistical function value is less than or equal to the predetermined difference value.

FIG. 4 is a block diagram that illustrates in more detail the embodiment of the invention shown in FIG. 3. According to this embodiment, processor 320, as shown in FIG. 3, includes a bus 402 or other communication mechanism for communicating information, and a central processing unit (CPU) 404 coupled with bus 402 for processing information. Processor 320 also includes a main memory 406, such as a random access memory (RAM) or other dynamic storage device, coupled to bus 402 for storing information and instructions to be executed by CPU 404. Main memory 406 also may be used for storing temporary variables or other intermediate information during execution of instructions to be executed by CPU 404. Processor 320 further includes a read only memory (ROM) 408 or other static storage device coupled to bus 402 for storing static information and instructions for CPU 404. A storage device 410, such as a magnetic disk or optical disk, is provided and coupled to bus 402 for storing information and instructions.

Processor 320 is coupled, as via bus 402, to monitor 330 (FIG. 3), such as a cathode ray tube (CRT), for displaying information to a computer user. An input device 414, including alphanumeric and other keys, is coupled to bus 402 for communicating information and command selections to CPU 404. Another type of user input device is cursor control 416, such as a mouse, a trackball, or cursor direction keys for communicating direction information and command selections to CPU 404 and for controlling cursor movement on monitor 330.

Imager 310 (FIG. 3) inputs data representative of CDs of features formed on the surface of an article such as a semiconductor wafer, under inspection, as discussed above, to bus 402. Such data may be stored in main memory 406 and/or storage device 410, and used by CPU 404 as it executes instructions. Imager 310 may also receive instructions via bus 402 from CPU 404.

The invention is related to the use of processor 320 for inspecting features formed on the surface of an article, such as a semiconductor wafer. According to an embodiment of the invention, inspection of the surface of the semiconductor wafer is provided by processor 320 in response to CPU 404 executing one or more sequences of one or more instructions contained in main memory 406. Such instructions may be read into main memory 406 from another computer-readable medium, such as storage device 410. Execution of the sequences of instructions contained in main memory 406 causes CPU 404 to perform the process steps described above. One or more processors in a multi-processing arrangement may also be employed to execute the sequences of instructions contained in main memory 406. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow charts of FIGS. 2A–2C.

The term "computer-readable medium" as used herein refers to any medium that participates in providing instructions to CPU 404 for execution. Such a medium may take many forms, including but not limited to, non-volatile media, volatile media, and transmission media. Non-volatile media include, for example, optical or magnetic disks, such as storage device 410. Volatile media include dynamic memory, such as main memory 406. Transmission media include coaxial cable, copper wire and fiber optics, including the wires that comprise bus 402. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 404 for execution. For example, the instructions may initially be borne on a magnetic disk of a remote computer. The remote computer can load the instructions into its dynamic memory and send the instructions over a telephone line using a modem. A modem local to processor 320 can receive the data on the telephone line and use an infrared transmitter to convert the data to an infrared signal. An infrared detector coupled to bus 402 can receive the data carried in the infrared signal and place the data on bus 402. Bus 402 carries the data to main memory 406, from which CPU 404 retrieves and executes the instructions. The instructions received by main memory 406 may optionally be stored on storage device 410 either before or after execution by CPU 404.

Because it does not limit the fields to be sampled to a fixed number of fields, the inventive semiconductor wafer inspection technique eliminates oversampling, which wastes time and reduces production throughput, and undersampling, which yields inaccurate statistical results. Oversampling is avoided by providing that the inspection terminates when two consecutive measured CDs do not significantly change the running statistical function value (average, standard deviation, etc.), thereby indicating that no further sampling is necessary to accurately represent the CD variations. Undersampling is avoided by providing that the sampling continues if either one of the last two measured CDs significantly changes the running statistical function value, thereby indicating additional data points are necessary to accurately represent the CD variations. Thus, the present invention contributes to the maintenance of high production throughput while providing more accurate information relating to feature CD variation, thereby facilitating the identification of processes causing defects and enabling early corrective action to be taken.

The present invention is applicable to the inspection of any semiconductor wafer, and is especially useful for in-process inspection of semiconductor wafers during manufacture of high density semiconductor devices with submicron design features.

The present invention can be practiced by employing conventional materials, methodology and equipment. Accordingly, the details of such materials, equipment and methodology are not set forth herein in detail. In the previous descriptions, numerous specific details are set fort such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of inspecting the surface of an article having a plurality of comparable pattern units, each pattern unit having a feature, which method comprises:
   (a) selecting for measurement a number of the plurality of pattern units;
   (b) measuring a critical dimension (CD) of the feature in each of the selected pattern units to produce a first plurality of CDs;
   (c) calculating a statistical function using the first plurality of CDs to produce a first statistical function value;
   (d) selecting for measurement at least one additional pattern unit of the plurality of pattern units;
   (e) measuring the CD of the feature in the at least one additional pattern unit;
   (f) calculating the statistical function using the first plurality of CDs and the CD of the feature in the at least one additional pattern unit to produce a current statistical function value; and
   (g) comparing the first and current statistical function values to produce a first differential statistical function value, and terminating the inspection when the first differential statistical function value is less than or equal to a predetermined differential statistical function value;
wherein when the first differential statistical function value is greater than the predetermined differential statistical function value, the method further comprises:
   (h) selecting a further additional pattern unit of the plurality of pattern units for measurement;
   (i) measuring the CD of the feature in the further additional pattern unit;
   (j) calculating the statistical function using the first plurality of CDs and the CDs of the features in all the additional pattern units to produce an updated statistical function value;
   (k) comparing the current and updated statistical function values to produce a current differential statistical function value; and
   (l) terminating the inspection when the current differential statistical function value is less than or equal to the predetermined differential statistical function value.

2. The method of claim 1, wherein the pattern units are randomly selected for measurement.

3. The method according to claim 2, wherein each of the pattern units has a plurality of comparable features, the method further comprising randomly selecting one of the plurality of comparable features for measurement in each of the selected pattern units.

4. The method according to claim 1, further comprising repeating steps (h) through (l) when the current differential statistical function value is greater than the predetermined differential statistical function value, using the updated statistical function value of the previous iteration of step (j) as the current statistical function value in step (k).

5. The method according to claim 1, comprising calculating the statistical function by calculating the standard deviation of the measured CDs.

6. The method according to claim 1, comprising calculating the statistical function by calculating the average of the measured CDs.

7. The method according to claim 1, comprising calculating the statistical function by calculating the t-test of the measured CDs.

8. The method according to claim 1, wherein the article is a semiconductor wafer, and the pattern units are substantially identical integrated circuit dies.

9. A computer-readable medium bearing instructions for inspecting the surface of an article having a plurality of comparable pattern units, each pattern unit having a feature, said instructions, when executed, being arranged to cause one or more processors to perform the steps of:
   (a) selecting for measurement a number of the plurality of pattern units;
   (b) controlling an inspection tool to measure a critical dimension (CD) of the feature in each of the selected pattern units to produce a first plurality of CDs;
   (c) calculating a statistical function using the first plurality of CDs to produce a first statistical function value;
   (d) selecting for measurement at least one additional pattern unit of the plurality of pattern units;
   (e) controlling the inspection tool to measure the CD of the feature in the at least one additional pattern unit;
   (f) calculating the statistical function using the first plurality of CDs and the CD of the feature in the at least one additional pattern unit to produce a current statistical function value; and
   (g) comparing the first and current statistical function values to produce a first differential statistical function value, and terminating the inspection when the first differential statistical function value is less than or equal to a predetermined differential statistical function value;

wherein the instructions, when executed, are further arranged to cause, when the first differential statistical function value is greater than the predetermined differential statistical function value, the one or more processors to perform the steps of:

(h) selecting a further additional pattern unit of the plurality of pattern units for measurement;

(i) controlling the inspection tool to measure the CD of the feature in the further additional pattern unit;

(j) calculating the statistical function using the first plurality of CDs and the CDs of the features in all the additional pattern units to produce an updated statistical function value;

(k) comparing the current and updated statistical function values to produce a current differential statistical function value; and (l) terminating the inspection when the current differential statistical function value is less than or equal to the predetermined differential statistical function value.

10. The computer-readable medium according to claim 9, wherein the instructions, when executed, are arranged to cause the one or more processors to randomly select the pattern units for measurement.

11. The computer-readable medium according to claim 10, wherein each of the pattern units has a plurality of comparable features, and the instructions, when executed, are arranged to cause the one or more processors to perform the step of randomly selecting one of the plurality of comparable features for measurement in each of the selected pattern units.

12. The computer-readable medium according to claim 9, wherein the instructions, when executed, are arranged to cause the one or more processors to repeat steps (h) through (l) when the current differential statistical function value is greater than the predetermined differential statistical function value, using the updated statistical function value of the previous iteration of step (j) as the current statistical function value in step (k).

13. The computer-readable medium according to claim 9, wherein the instructions, when executed, are arranged to cause the one or more processors to perform the steps of calculating the statistical function by calculating the standard deviation of the measured CDs.

14. The computer-readable medium according to claim 9, wherein the instructions, when executed, are arranged to cause the one or more processors to perform the steps of calculating the statistical function by calculating the average of the measured CDs.

15. The computer-readable medium according to claim 9, wherein the instructions, when executed, are arranged to cause the one or more processors to perform the steps of calculating the statistical function by calculating the t-test of the measured CDs.

16. An inspection tool for inspecting the surface of an article, the article having a plurality of comparable pattern units, each pattern unit having a feature, the inspection tool comprising:

an imager for measuring a critical dimension (CD) of the feature; and a processor configured to:

(a) select for measurement a number of the plurality of pattern units;

(b) control the imager to measure a critical dimension (CD) of the feature in each of the selected pattern units to produce a first plurality of CDs;

(c) calculate a statistical function using the first plurality of CDs to produce a first statistical function value;

(d) select for measurement at least one additional pattern unit of the plurality of pattern units;

(e) control the imager to measure the CD of the feature in the at least one additional pattern unit;

(f) calculate the statistical function using the first plurality of CDs and the CD of the feature in the at least one additional pattern unit to produce a current statistical function value; and (g) compare the first and current statistical function values to produce a first differential statistical function value, and terminate the inspection when the first differential statistical function value is less than or equal to a predetermined differential statistical function value;

wherein the processor is further configured, when the first differential statistical function value is greater than the predetermined differential statistical function value, to:

(h) select a further additional pattern unit of the plurality of pattern units for measurement;

(i) control the imager to measure the CD of the feature in the further additional pattern unit;

(j) calculate the statistical function using the first plurality of CDs and the CDs of the features in all the additional pattern units to produce an updated statistical function value;

(k) compare the current and updated statistical function values to produce a current differential statistical function value; and (l) terminate the inspection when the current differential statistical function value is less than or equal to the predetermined differential statistical function value.

17. The inspection tool of claim 16, wherein the processor is further configured to randomly select the pattern units for measurement.

18. The inspection tool of claim 17, wherein each of the pattern units has a plurality of comparable features, and wherein the processor is further configured to randomly select one of the plurality of comparable features for measurement in each of the selected pattern units.

19. The inspection tool of claim 16, wherein the processor is further configured to repeat steps (h) through (l) when the current differential statistical function value is greater than the predetermined differential statistical function value, using the updated statistical function value of the previous iteration of step (j) as the current statistical function value in step (k).

20. The inspection tool of claim 16, wherein the processor is further configured to calculate the statistical function by calculating the standard deviation of the measured CDs.

21. The inspection tool of claim 16, wherein the processor is further configured to calculate the statistical function by calculating the average of the measured CDs.

22. The inspection tool of claim 16, wherein the processor is further configured to calculate the statistical function by calculating the t-test of the measured CDs.

23. The inspection tool of claim 16, wherein the imager is a critical dimension scanning electron microscope (CD-SEM), an optical inspection tool, a defect review scanning electron microscope, or an atomic force microscope.

24. The inspection tool of claim 16, further comprising a monitor for displaying the measured CDs.

* * * * *